US011163029B2

United States Patent
Nimbargi et al.

(10) Patent No.: US 11,163,029 B2
(45) Date of Patent: Nov. 2, 2021

(54) MRI SYSTEM WITH IMPROVED NAVIGATOR

(71) Applicant: GE Precision Healthcare LLC, Wauwatosa, WI (US)

(72) Inventors: Vijay Shivalingappa Nimbargi, Wauwatosa, WI (US); Dawei Gui, Wauwatosa, WI (US); Liewei Sha, Wauwatosa, WI (US); Surrendra K. Markandaya, Wauwatosa, WI (US); Ty A. Cashen, Wauwatosa, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 141 days.

(21) Appl. No.: 16/540,804

(22) Filed: Aug. 14, 2019

(65) Prior Publication Data
US 2021/0048497 A1 Feb. 18, 2021

(51) Int. Cl.
*G01R 33/567* (2006.01)
(52) U.S. Cl.
CPC ................ *G01R 33/5676* (2013.01)
(58) Field of Classification Search
CPC .............................. G01R 33/5676
See application file for complete search history.

(56) References Cited

U.S. PATENT DOCUMENTS

| 6,292,684 | B1 | 9/2001 | Du et al. | |
|---|---|---|---|---|
| 7,127,092 | B2* | 10/2006 | Jack | A61B 5/055 |
| | | | | 382/128 |
| 7,834,623 | B2* | 11/2010 | Iwadate | G01R 33/5676 |
| | | | | 324/307 |
| 7,945,079 | B2* | 5/2011 | Rosen | G06T 11/005 |
| | | | | 382/128 |
| 9,551,771 | B2* | 1/2017 | Son | G01R 33/56509 |
| 2009/0066329 | A1* | 3/2009 | Kanda | G01R 33/5676 |
| | | | | 324/309 |
| 2013/0127460 | A1* | 5/2013 | Beck | G01R 33/5676 |
| | | | | 324/309 |
| 2017/0199260 | A1 | 7/2017 | Goto | |
| 2019/0107595 | A1 | 4/2019 | Iwadate | |

FOREIGN PATENT DOCUMENTS

JP 2012205897 A * 10/2012 ....... G01R 33/56563

* cited by examiner

*Primary Examiner* — Susan S Lee

(57) ABSTRACT

A method of controlling magnetic resonance (MR) image data acquisition includes generating a plurality of one-dimensional (1D) navigator profiles reflecting motion of an anatomic boundary region of an imaging subject over time at a measurement interval, and then generating a plurality of navigator image segments each for a corresponding 1D navigator profile of the plurality of 1D navigator profiles. A navigator image is then generated based on the plurality of navigator image segments, and a determination is made whether to acquire MR image data based on the navigator image.

18 Claims, 6 Drawing Sheets

MRI SYSTEM WITH IMPROVED NAVIGATOR

BACKGROUND

The present disclosure generally relates to magnetic resonance imaging (MRI) and, more particularly, to an MRI system having an improved system for gating and/or triggering MR image acquisition based on periodic motion, such as respiration motion, of the patient.

Magnetic resonance (MR) imaging is often used to obtain internal physiological information of a patient, including for cardiac imaging and imaging other sections or tissues within a patient's torso (or anywhere on the patient). In certain body areas, such as portions in the torso, it is typically desirable to obtain an image at a particular point in a variable physiologic cycle (e.g. respiratory cycle and/or cardiac cycle), such as a peak of the variable cycle, to analyze behavior during that peak. Gating and triggering are often used for such purposes. "Triggering" refers to determining whether to start acquisition based on the signal (for example, respiratory, navigator, cardiac, external, etc.). "Gating" refers to determining whether to accept or reject data that is acquired continuously. The most common techniques of gating include cardiac, respiratory, and peripheral pulse gating, and these types of gating have uses in numerous medical applications across diagnostic modalities such as CT, MR, x-ray, ultrasound, and position emission tomography (PET). Respiratory gating, for example, is an essential component of cardiac imaging while using imaging modalities, including MR, to minimize motion-related artifacts resulting from the patient's respiration motion.

In MR imaging, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", Mz, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using reconstruction techniques.

For example, MR images of the cardiac region or abdominal region are often used by health care professionals to diagnose medical conditions. Traditional MR evaluations of the cardiac or abdominal regions often rely on repeated cardiac-gated and/or respiratory-gated acquisition of MR data in order to reduce image degradation resulting from the continuous movement of the imaged tissues due to respiratory and/or circulatory physiological functions.

Accordingly, respiratory gating and/or cardiac gating are often used in acquisition of MR data, which rely on detection of a particular point in the motion cycle as a trigger to repeatedly acquire data at approximately the same phase of the motion cycle. Navigators are employed as one means of tracking respiratory, cardiac, or other periodic or semi-periodic patient motion. Navigators employ additional RF-pulses to dynamically track anatomic motion of a particular anatomic region of the patient, especially a superior-inferior (SI) position of the diaphragm. For example, navigator pulses may be spin echo (SE) or gradient echo (GRE).

Navigators tracking respiration are typically configured to track movement of the boundary region between the patient's lungs and liver as the patient breaths. A method of obtaining information on respiration using a pencil-beam RF pulse has been known as one imaging technique for respiration gating. By using the pencil-beam RF pulse, excitation of a cylindrical region including a section of the patient's lung and a section of the patient's liver in an SI (superior-inferior) direction may be achieved; therefore, the method is suitable for detection of motion of a boundary location of the liver. Movement of the boundary location corresponds to the patient's respiratory activity, and thus tracking the motion of the boundary region can be used to time MR data acquisition. This method of respiration activity tracking for respiration gating or triggering is used particularly in abdominal imaging.

Though navigators are primarily used to track diaphragm motion due to respiration, they can be placed through any moving object to track motion, such as the heart. Navigators are used to track and correct for cardiac motion in cardiac MRIs, for example, where navigator echoes are incorporated into multi-shot diffusion-weighted pulse sequences to correct for motion that occurs during image acquisition.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

In one embodiment, a method of controlling magnetic resonance (MR) image data acquisition includes generating a plurality of one-dimensional (1D) navigator profiles reflecting motion of an anatomic boundary region of an imaging subject over time at a measurement interval, and then generating a plurality of navigator image segments each for a corresponding 1D navigator profile of the plurality of 1D navigator profiles. A navigator image is then generated based on the plurality of navigator image segments, and a determination is made whether to acquire MR image data based on the navigator image.

One embodiment of a magnetic resonance imaging (MRI) system includes one or more RF coils configured to generate a navigator pulse on an imaging subject and receive, at a measurement interval, RF signals excited by the navigator pulse from the imaging subject. The system further includes a processing system configured to generate, based on the received RF signals, a plurality of one-dimensional (1D) navigator profiles reflecting motion of an anatomic boundary region of the imaging subject over time at the measurement interval, and to generate a plurality of navigator image segments each for a corresponding 1D navigator profile of the plurality of 1D navigator profiles. A navigator image is then generated based on the plurality of navigator image segments, and then the processing system determines whether to acquire MR image data based on the navigator image.

Various other features, objects, and advantages of the invention will be made apparent from the following description taken together with the drawings.

BRIEF DESCRIPTION OF THE DRAWINGS

The present disclosure is described with reference to the following Figures.

DETAILED DESCRIPTION

Figure 1:
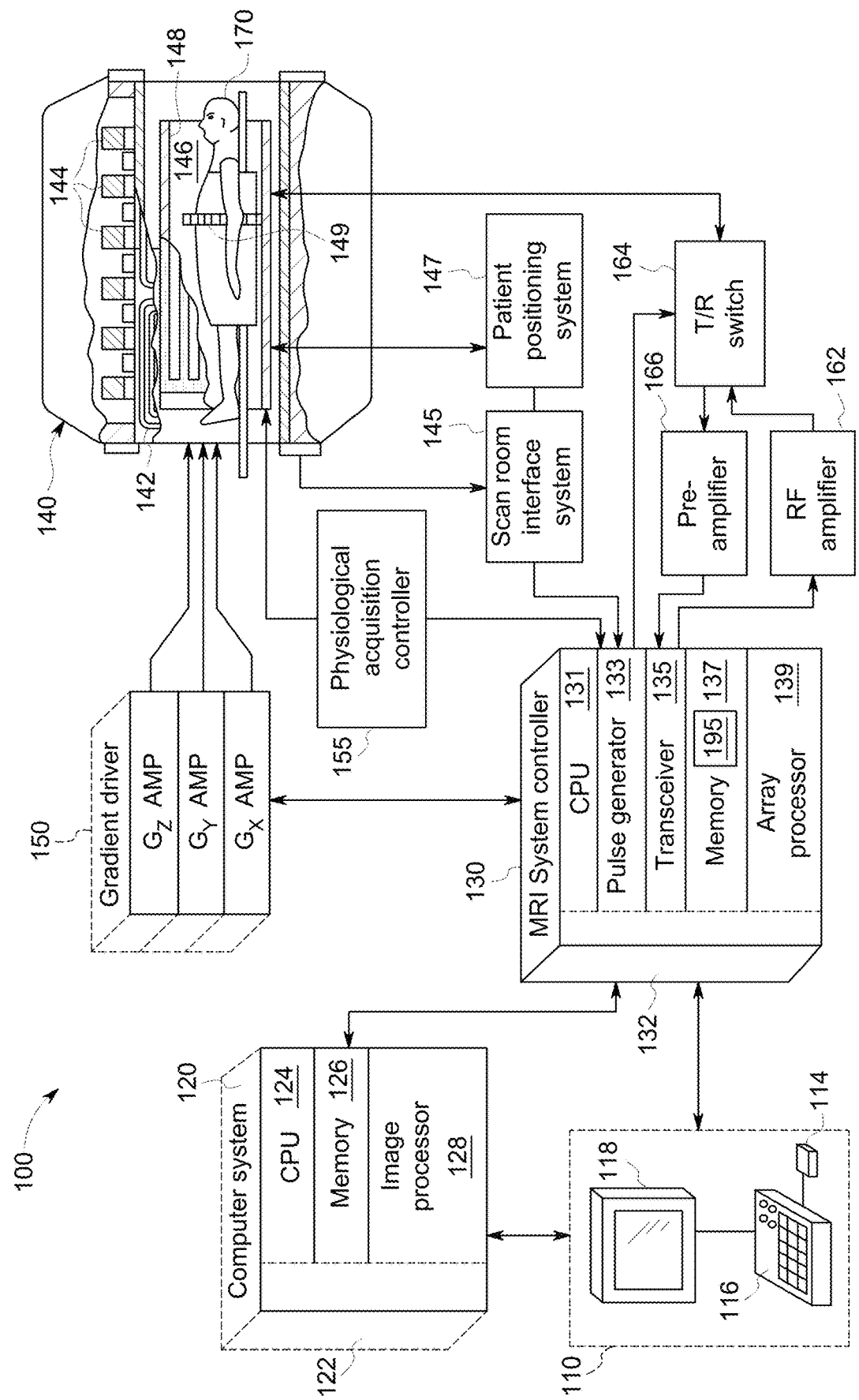
FIG. 1 is a schematic diagram of an MRI system in accordance with an exemplary embodiment.

Referring to FIG. 1, a schematic diagram of an exemplary MRI system 100 is shown in accordance with an embodiment. The operation of MRI system 100 is controlled from an operator workstation 110 that includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The components of the computer system 120 include a central processing unit (CPU) 124, a memory 126, which may include a frame buffer for storing image data, and an image processor 128. In an alternative embodiment, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130

The MRI system controller 130 includes a set of components in communication with each other via electrical and/or data connections 132. The MRI system controller connections 132 may be direct wired connections, fiber optic connections, wireless communication links, or the like. The components of the MRI system controller 130 include a CPU 131, a pulse generator 133, which is coupled to and communicates with the operator workstation 110, a transceiver 135, a memory 137, and an array processor 139. In an alternative embodiment, the pulse generator 133 may be integrated into a resonance assembly 140 of the MRI system 100. The MRI system controller 130 is coupled to and receives commands from the operator workstation 110 to indicate the MR scan sequence to be performed during a MR scan. The MRI system controller 130 is also coupled to and communicates with a gradient driver system 150, which is coupled to a gradient coil assembly 142 to produce magnetic field gradients during a MR scan.

The pulse generator 133 may also receive data from a physiological acquisition controller 155 that receives signals from a plurality of different sensors connected to an object or patient 170 undergoing a MR scan, including electrocardiography (ECG) signals from electrodes attached to the patient 170. And finally, the pulse generator 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a table 171. The table 171 is controllable to move the patient in and out of the core 146 and to move the patient to a desired position within the core 146 for a MR scan.

The MRI system controller 130 provides gradient waveforms to the gradient driver system 150, which includes, among others, $G_X$, $G_Y$ and $G_Z$ amplifiers. Each $G_X$, $G_Y$ and $G_Z$ gradient amplifier excites a corresponding gradient coil in the gradient coil assembly 142 to produce magnetic field gradients used for spatially encoding MR signals during a MR scan. The gradient coil assembly 142 is included within the resonance assembly 140, which also includes a superconducting magnet having superconducting coils 144, which in operation, provides a homogenous longitudinal magnetic field $B_0$ throughout a core 146, or open cylindrical imaging volume, that is enclosed by the resonance assembly 140. The resonance assembly 140 also includes a RF body coil 148 which in operation, provides a transverse magnetic field $B_1$ that is generally perpendicular to $B_0$ throughout the core 146. The resonance assembly 140 may also include RF surface coils 149 used for imaging different anatomies of a patient undergoing a MR scan. The RF body coil 148 and RF surface coils 149 may be configured to operate in a transmit and receive mode, transmit mode, or receive mode.

An object or patient 170 undergoing an MR scan may be positioned within the core 146 of the resonance assembly 140. The transceiver 135 in the MRI system controller 130 produces RF excitation pulses that are amplified by an RF amplifier 162 and provided to the RF body coil 148 and RF surface coils 149 through a transmit/receive switch (T/R switch) 164.

As mentioned above, RF body coil 148 and RF surface coils 149 may be used to transmit RF excitation pulses and/or to receive resulting MR signals from a patient undergoing an MR scan. The resulting MR signals emitted by excited nuclei in the patient undergoing an MR scan may be sensed and received by the RF body coil 148 or one or more RF surface coils 149 and sent back through the T/R switch 164 to a pre-amplifier 166. The amplified MR signals are demodulated, filtered and digitized in the receiver section of the transceiver 135.

The T/R switch 164 is controlled by a signal from the pulse generator 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode. The resulting MR signals sensed and received by the RF body coil 148 are digitized by the transceiver 135 and transferred to the memory 137 in the MRI system controller 130.

A MR scan is complete when an array of raw k-space data, corresponding to the received MR signals, has been acquired and stored temporarily in the memory 137 until the data is subsequently transformed to create images. This raw k-space data is rearranged into separate k-space data arrays for each image to be reconstructed, and each of these separate k-space data arrays is input to the array processor 139, which operates to Fourier transform the data into arrays of image data.

The array processor 139 uses a known transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118. In various embodiments, the components of computer system 120 and MRI system controller 130 may be implemented on the same computer system or a plurality of computer systems.

Figure 2:
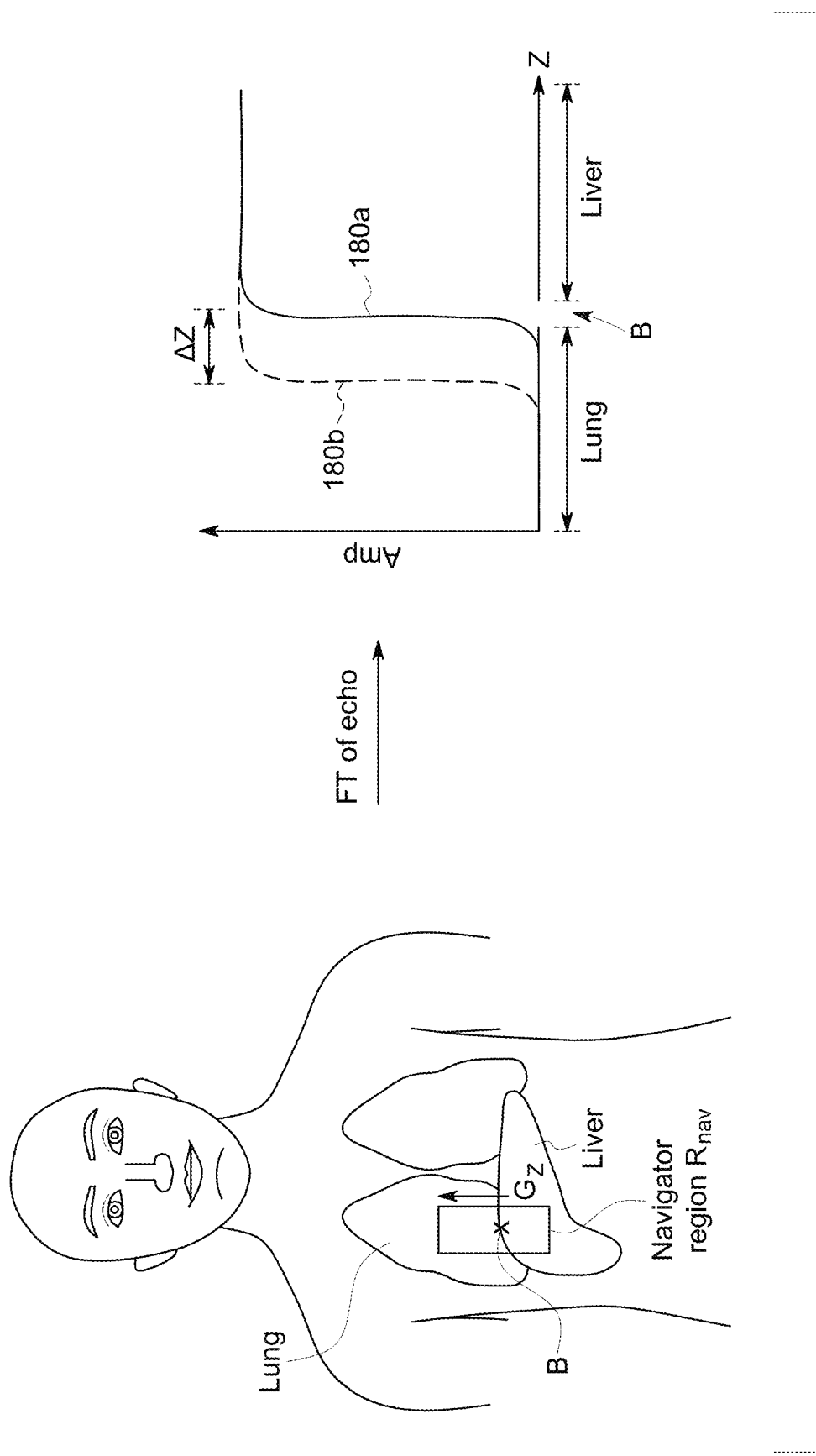
FIG. 2 is a diagram schematically depicting an anatomic boundary region of a patient, and in particular a lung-liver boundary region, and a corresponding navigator profile for two exemplary diaphragm positions.

FIG. 2 schematically depicts an exemplary navigator region $R_{nav}$ imaged by the system 100. The exemplary depicted navigator region $R_{nav}$ is a coronal image that includes the liver and the lungs, and a boundary B between the liver and the lungs. In the depicted example, the boundary B is the uppermost end of the liver. The navigator region $R_{nav}$ is generated using a pencil beam in the z direction (gradient $G_y$ and $G_z$) through the diaphragm. To provide just one example, the navigator band may be 1-2 cm wide with about 1 mm spatial resolution along the beam. The Fourier transform of the gradient echo yields the projection of the pencil beam's magnetization onto the z-axis to generate a navigator profile 180, which is referred to as a one dimensional (1D), or one directional, navigator profile. This allows monitoring of in-vivo motion along one dimension, or one direction, generating a 1D navigator profile. The graph on the right-hand side depicts a navigator profile 180a, 180b for two different diaphragm positions during a respiratory cycle. Since the lungs contain air, they generally yield lower-intensity signals than the liver. The edge portion between the low-intensity lung echo and the higher-intensity liver echo can be identified as the boundary B. The boundary B moves back and forth along the z-axis as the lung-liver boundary moves up and down during the breath cycle. In the example, the boundary B moves by an amount $\Delta z$ between the first navigator profile 180a and the second navigator profile 180b. The breath cycle can be tracked by tracking the movement of the boundary B across navigator profiles collected over time.

The inventors have recognized that signal variation in the navigator profiles can cause inaccurate estimation of respiratory motion due to inaccurate location of the boundary B feature within the profile. More particularly, through their experimentation and research in the relevant field, the inventors have recognized that estimations of respiratory motion based on 1D navigator profile has only about an 80% accuracy rate due to inaccurate identification of the boundary B location within the navigator profile. Thus, respiratory motion detection via 1D navigator data can yield an unacceptably high failure rate. Existing solutions for reducing boundary detection inaccuracy typically involve utilizing 2D profile data. However, the inventors have recognized that generation of 2D navigator data requires significant imaging resources and time, and thus delays image acquisition, extends scan times, and increases processing burdens. Accordingly, the inventors have endeavored to develop a more accurate motion detection system, for respiratory motion in particular, that is implemented utilizing 1D navigator data.

Figure 3:
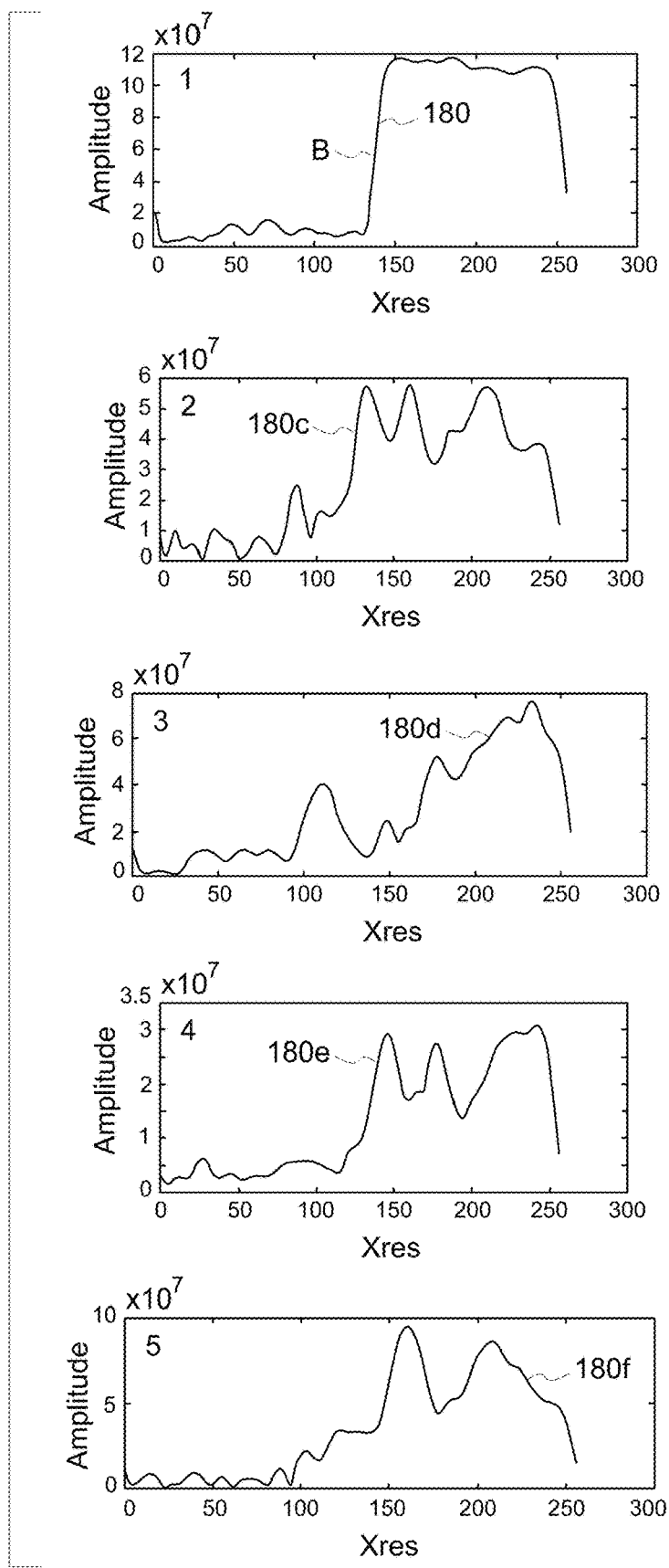
FIG. 3 depicts exemplary navigator profiles.

Referring to FIG. 3, graph 1 depicts an ideal navigator profile 180. Graphs 2 through 5 depict other exemplary navigator profiles 180c-180f observed in routine scanning. Such large variation in navigator profiles creates a challenge for accurate motion detection. While the boundary B is easily identified in the ideal navigator profile 180, the boundary is less easily identified in the navigator profiles 180c-180f, which are more realistic reflections of navigator profiles generated in the field. The variation in navigator profiles is a result of patient variation. The shape of the 1D profile is influenced by multiple parameters, such as contrast injection, fat suppression, blood flow, susceptibility, etc.

Figure 4:
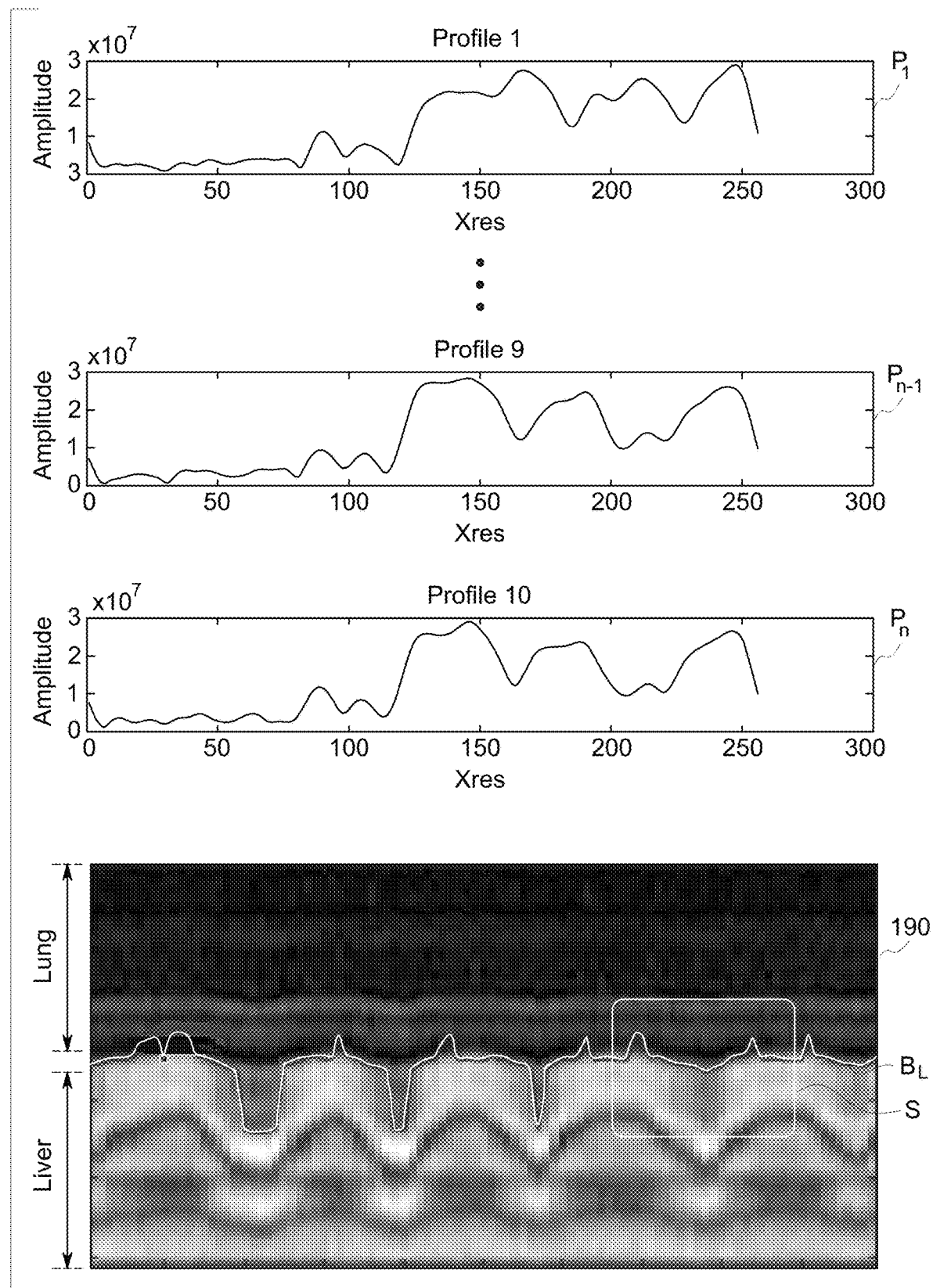
FIG. 4 depicts exemplary navigator profiles and a navigator image generated therefrom.

A small change in the navigator profiles P can have a significant negative impact on the boundary detection, and thus the motion estimation. FIG. 4 exemplifies such an error, where the motion estimation is significantly impacted and the breath cycle is not accurately detected in section S of the image due to signal variations in the navigator profiles, e.g., $P_1$-$P_n$.

In view of the foregoing problems and challenges in the relevant field, the inventors developed the disclosed system and method for improved navigator triggering or gating. The inventors recognized that, when viewed as a 2D image, it is possible to more accurately identify the respiratory motion pattern. More particularly, the inventors have recognized that the boundary location can be identified by utilizing image segmentation for identifying the boundary B within the image generated by multiple navigator profiles 180. FIG. 4 depicts an exemplary image 190 generated based on a predefined number of navigator profiles $P_1$ through $P_n$. The profiles $P_1$ through $P_n$ recorded over time are stacked together to generate a 2D image. The boundary line $B_L$ is identified as the boundaries B of each of the navigator profiles $P_n$ through $P_n$.

Figure 5:
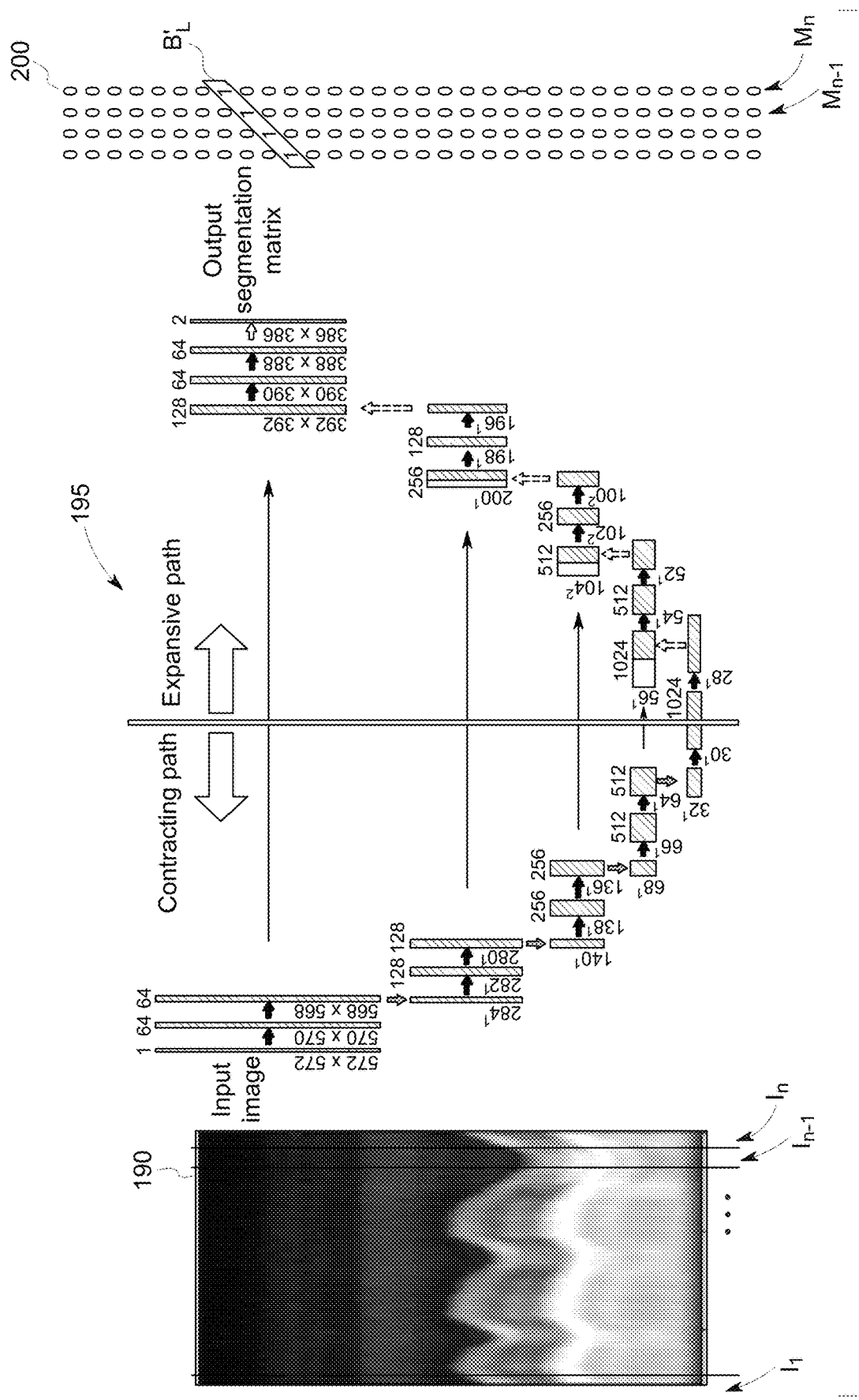
FIG. 5 schematically depicts a representative navigator image input and a U-Net structured convolutional neural network trained to generate a navigator matrix based on the navigator image.

The top, darker portion of the navigator image 190 represents the lung tissue occupying the navigator region $R_{nav}$, while the lower, lighter portion represents the liver tissue in the imaged region $R_{nav}$. Specifically, each navigator profile $P_1$ through $P_n$ (FIG. 4) is processed to generate a corresponding navigator image segment $I_1$ through $I_n$ (FIG. 5). For example, the navigator image segment $I_1$ through $I_n$ may be generated by assigning a grayscale value, or some other value (such as a color palette value), to each sample point in the navigator profile P. The navigator image 190 is then generated as a collection of a predefined number of navigator image segments $I_1$ through $I_n$. Each navigator profile $P_1$ through $P_n$ is stacked side-by-side, presenting oldest to newest (most-recent), thus showing the navigator region $R_{nav}$ over time.

To provide just one example, the navigator image 190 may comprise 64 navigator image segments I, each representing a navigator profile P. In other embodiments, fewer or more navigator image segments I may be stacked to generate the navigator image 190. The navigator image 190 is updated as each new navigator profile P comes in and thus always represents the predefined number of most recent navigator profiles P. Thus, the navigator image 190 is updated each measurement interval. To provide just one example, the system may be configured to generate a navigator profile P at 100 millisecond intervals, and thus the navigator image 190 is updated every 100 milliseconds to include the most-recent navigator profile P.

As described herein, the disclosed system and method utilize image segmentation to identify the boundary location $B_L$ across the image 190 where the image is partitioned into multiple segments, pixels, or sets of pixels, which are each given a value based on whether the boundary B is identified in the segments. A navigator matrix 200 is generated representing the segment location of the boundary identification in each navigator profile P.

In certain examples, a deep learning based neural networks, such as U-Net, can be utilized to perform image segmentation in order to identify the boundary location $B_L$ in the image 190 and to generate a navigator matrix 200 identifying the boundary location $B_L$ across the image 190. In the example at FIG. 5, the navigator matrix 200, which shows only a portion of a full navigator matrix for a navigator image 190, shows the boundary location $B_L'$ (circled to provide visual identification in the figure). The navigator matrix 200 includes a column representing each navigator image segment, wherein each navigator image segment represents a navigator profile 180. For example, the column $M_n$ represents the portion of the navigator matrix 200 associated with the most recent navigator profile $P_n$. Similarly, the portion, or column $M_{n-1}$, of the navigator matrix 200 represents the navigator profile $P_{n-1}$.

As described above, after substantial experimentation and research, the inventors have recognized that one or more trained neural networks can be particularly effective at generating a navigator matrix based on a navigator image by identifying a boundary B in the wide range of navigator profiles 180, P that result, largely due to patient variation. In certain embodiments, a second neural network may be trained to analyze the navigator matrix and to indicate whether to acquire MR image data. In various embodiments, the first and/or second neural networks may be a convolutional neural network, a recurrent neural network, or a combination thereof.

FIG. 5 represents one embodiment where the trained neural network 195 is a U-Net neural network architecture used for performing image segmentation on an inputted navigator image 190. The U-Net is trained using navigator images 190 generated from 1D navigator profiles as described above. The sample navigator profile data represents a wide variety of patient physiologies, and thus wide variations in navigator profile data. The input images 190 are of a predefined size. To provide one example, the input images representing navigator data may be 128×256 pixels, or arrays.

For each image of a predefined size, a corresponding matrix is generated for training purposes. Such a matrix is exemplified in a representative way by the navigator matrix 200 in FIG. 5, where the boundary location $B_L$ in the corresponding navigator image 190 is circled. The training matrix generation may be performed by automated labeling, such as by utilizing advanced signal processing algorithms, such as least square error (LSE) and edge detection algorithms, combined with manual review and labeling in order to identify the errors in automated labeling. The U-Net, or other neural network architecture (e.g., other convolutional neural network type) may be trained using an Adam optimizer or optimization and utilizing a Dice coefficient minimization as the loss function.

FIG. 5 schematically represents a U-Net architecture for the trained neural network 195. The controller 130 generates the navigator scans and navigator profiles 180, or navigator sequence data, which are scans performed in addition to imaging scans per standard navigator system operation well known in the relevant art. Data acquisition happens through controlled pulse generation via the pulse generator 133, and image data processing is performed on the array processors 139 or CPU 131 of the MRI system controller 130. In certain embodiments described herein, a trained neural network 195 may be stored in memory 137 of the MRI system controller 130, which is executable as described herein to generate a navigator matrix 200 for use in controlling MR data acquisition, such as for respiratory gating or triggering.

In a different embodiment, a derived algorithm may be utilized to generate the navigator matrix based on the navigator image. The algorithm may be identified based on a dataset representing a wide variety of patient physiologies, and thus wide variations in navigator profile data, and corresponding manually-generated matrices. These initial matrices may be generated for a dataset by automated labeling, such as by utilizing least square error (LSE) and edge detection algorithms, combined with manual review and labeling in order to identify the errors in automated labeling. In one embodiment, an algorithm for generating a navigator matrix based on a navigator image may be derived by using advanced image segmentation techniques, such as multi-scale segmentation, thresholding-based techniques, region growing, etc.

Figure 6:
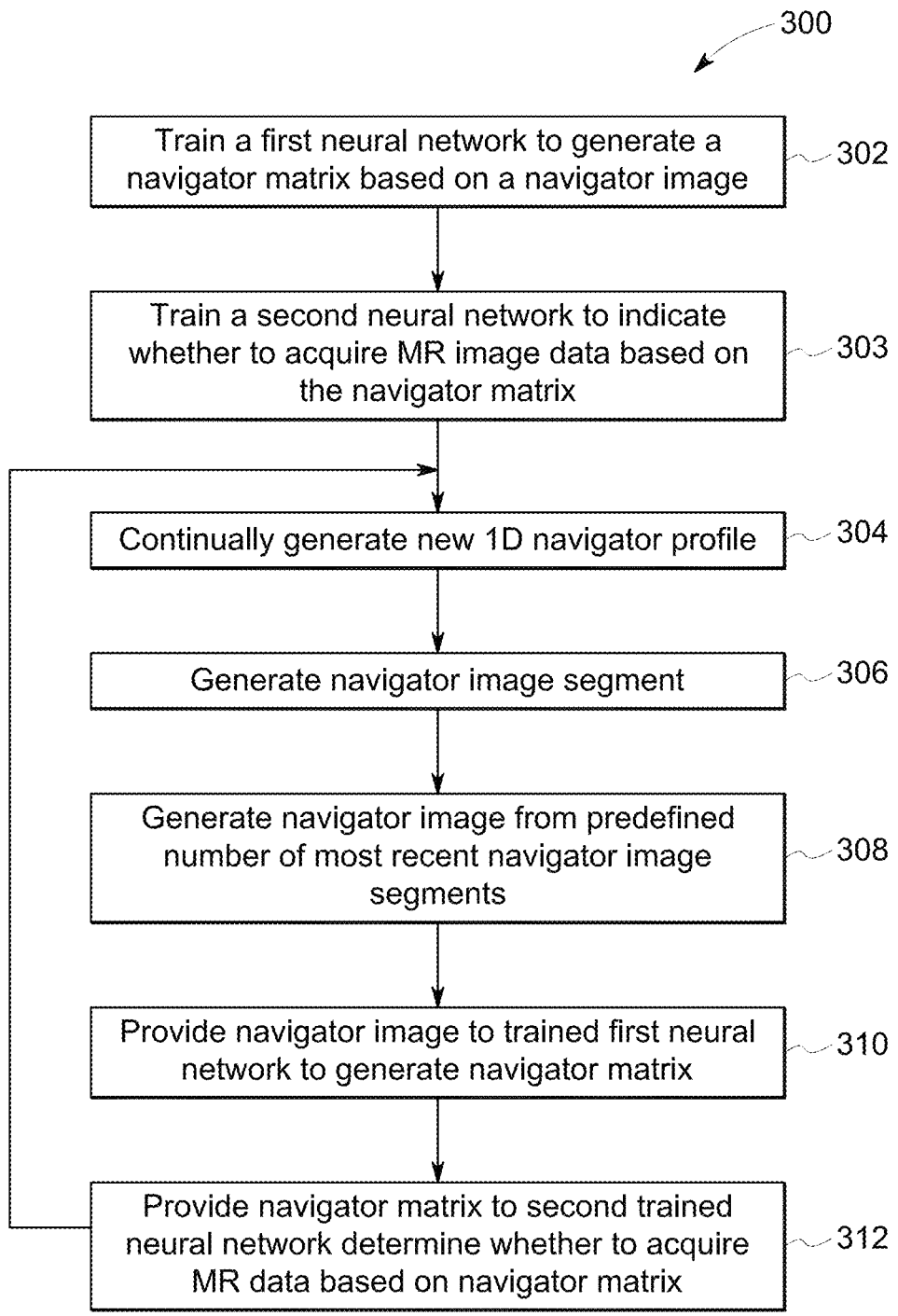
FIG. 6 depicts one embodiment of a method of controlling MRI data acquisition according to one embodiment of the disclosure.

FIG. 6 represents one embodiment of a method 300 of controlling MR data acquisition utilizing the deep learning-based approached for navigator gating or triggering. A first neural network, such as a U-Net architecture, is trained at step 302 to generate a navigator matrix based on an inputted navigator image. A second neural network is trained at step 303 to generate a decision whether to acquire MR image data based on the navigator matrix outputted by the first neural network. In still other embodiments, a single neural network may be trained to determine whether to acquire MR image data based on the image data. As described herein, the disclosed method and system for determining whether to acquire image data may be applied for gating or triggering purposes.

Exemplary training methods are described above, where labeled navigator profile data representing a wide variety of patient physiologies, where training is performed utilizing and Adam optimizer and a Dice coefficient loss function. A person having ordinary skill in the art will understand in view of the present disclosure that other neural network architectures and other optimizers and loss functions may be utilized to generate a trained neural network according to the present disclosure.

The trained neural networks are is then implemented to determine whether to acquire MR image data based on the navigator image, as exemplified in the remaining steps. Represented at step 304, 1D navigator profiles are continually generated at the measurement interval. As each new 1D navigator profile comes in, a navigator image segment is generated at step 306. Once a predetermined number of image segments are acquired, a navigator image is generated at step 308, which then gets updated each time a new image segment is generated. For example, the navigator image may be generated from a predefined number of most recent navigator image segments, in a first-in-first-out method where the oldest navigator image segment is removed from one end and the newest navigator image segment is added at the other end of the stack. The navigator image is then provided to the trained first neural network at step 310. The trained first neural network generates the navigator matrix. At step 312, the navigator matrix is provided to the second trained neural network to determine whether to acquire the MR data based on the navigator matrix. For example, the acquisition determination may be made based on the boundary location in the portion of the navigator matrix corresponding with the most recent navigator image segment (e.g., column $M_n$ in the navigator matrix 200 exemplified at FIG. 5) or based on a recent few navigator image segments.

This written description uses examples to disclose the invention, including the best mode, and also to enable any person skilled in the art to make and use the invention. Certain terms have been used for brevity, clarity and understanding. No unnecessary limitations are to be inferred therefrom beyond the requirement of the prior art because such terms are used for descriptive purposes only and are intended to be broadly construed. The patentable scope of the invention is defined by the claims, and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

We claim:

1. A method of controlling magnetic resonance (MR) image data acquisition, the method comprising:
    generating a plurality of one-dimensional (1D) navigator profiles reflecting motion of an anatomic boundary region of an imaging subject over time at a measurement interval;
    generating a plurality of navigator image segments each for a corresponding 1D navigator profile of the plurality of 1D navigator profiles;
    generating a navigator image based on the plurality of navigator image segments;
    determining whether to acquire MR image data based on the navigator image; and
    acquiring MR image data in one of a free-breathing abdominal scan, a cardiac scan, a vascular scan, or a pelvis scan in response to determining to acquire MR image data.

2. The method of claim 1, wherein generating the plurality of navigator image segments comprises for each navigator image segment, assigning a grayscale value or a color palette to each sample point in the corresponding 1D navigator profile.

3. The method of claim 1, wherein generating the navigator image comprises stacking the plurality of navigator image segments together, and wherein the navigator image is updated over time by adding one or more newest navigator image segments and removing one or more oldest navigator image segments.

4. The method of claim 1, wherein determining whether to acquire MR image data comprises utilizing a neural network that has been trained to indicate whether to acquire MR image data by analyzing the navigator image.

5. The method of claim 4, wherein the neural network is a convolutional neural network, a recurrent neural network, or a combination of convolutional neural network and recurrent neural network.

6. The method of claim 1, further comprising generating a navigator matrix identifying a boundary location in each navigator image segment of the plurality of navigator image segments, wherein the determination of whether to acquire MR image data is based on the navigator matrix.

7. The method of claim 6, wherein generating the navigator matrix comprises applying a derived algorithm to generate the navigator matrix from the navigator image.

8. The method of claim 7, wherein the determination of whether to acquire MR image data is based on the boundary location in a portion of the navigator matrix corresponding to one or more most recent navigator image segments.

9. The method of claim 6, wherein generating the navigator matrix comprises utilizing a first neural network that has been trained to map the navigator image to the navigator matrix, and wherein determining whether to acquire MR image data comprises utilizing a second neural network that has been trained to indicate whether to acquire MR image data by analyzing the navigator matrix.

10. A magnetic resonance imaging (MRI) system comprising:
    one or more RF coils configured to:
        generate a navigator pulse on an imaging subject; and
        receive, at a measurement interval, RF signals excited by the navigator pulse from the imaging subject; and
    a processing system configured to:
        generate, based on the received RF signals, a plurality of one-dimensional (1D) navigator profiles reflecting motion of an anatomic boundary region of the imaging subject over time at the measurement interval;
        generate a plurality of navigator image segments each for a corresponding 1D navigator profile of the plurality of 1D navigator profiles;
        generate a navigator image based on the plurality of navigator image segments;
        determine whether to acquire MR image data based on the navigator image; and
        acquire MR image data in one of a free-breathing abdominal scan, a cardiac scan, a vascular scan, or a pelvis scan in response to determining to acquire MR image data.

11. The system of claim 10, wherein the processing system is further configured to generate the plurality of navigator image segments by, for each navigator image segment, assigning a grayscale value or a color palette to each sample point in the corresponding 1D navigator profile.

12. The system of claim 10, wherein the processing system is further configured to generate the navigator image by stacking the plurality of navigator image segments together, and to update the navigator image over time by adding one or more newest navigator image segments and removing one or more oldest navigator image segments.

13. The system of claim 10, wherein the processing system is further configured to utilize a neural network trained to indicate whether to acquire MR image data by analyzing the navigator image to determine whether to acquire MR image data.

14. The system of claim 13, wherein the neural network is a convolutional neural network, a recurrent neural network, or a combination of convolutional neural network and recurrent neural network.

15. The system of claim 10, wherein the processing system is further configured to generate a navigator matrix identifying a boundary location in each navigator image segment of the plurality of navigator image segments, wherein the determination of whether to acquire MR image data is based on the navigator matrix.

16. The system of claim 15, wherein the processing system is further configured to apply a derived algorithm to generate the navigator matrix from the navigator image.

17. The system of claim 16, wherein the processing system is further configured to determine whether to acquire MR image data based on the boundary location in a portion of the navigator matrix corresponding to one or more most recent navigator image segments.

18. The system of claim 15, wherein the processing system is further configured to generate the navigator matrix utilizing a first neural network that has been trained to map the navigator image to the navigator matrix, and to determine whether to acquire MR image data utilizing a second neural network that has been trained to indicate whether to acquire MR image data by analyzing the navigator matrix.

* * * * *